United States Patent [19]

Hamada

[11] Patent Number: 5,113,371
[45] Date of Patent: May 12, 1992

[54] SEMICONDUCTOR MEMORY APPARATUS WITH A SPARE MEMORY CELL ARRAY

[75] Inventor: Mitsuhiro Hamada, Tokyo, Japan
[73] Assignee: NEC Corporation, Tokyo, Japan
[21] Appl. No.: 557,841
[22] Filed: Jul. 26, 1990
[30] Foreign Application Priority Data
  Jul. 26, 1989 [JP] Japan ................. 1-194948
[51] Int. Cl.[5] ................................ G11C 7/00
[52] U.S. Cl. ............................ 365/200; 365/201
[58] Field of Search ............. 365/200, 201, 210; 371/10.1, 10.2, 10.3, 21.1

[56] References Cited
U.S. PATENT DOCUMENTS
  4,567,580  1/1986  Varshney ............... 365/200
  4,860,260  8/1989  Saito et al. ............ 365/201

Primary Examiner—Joseph A. Popek
Attorney, Agent, or Firm—Sughrue, Mion, Zinn, Macpeak & Seas

[57] ABSTRACT

In a test of a fabricated semiconductor memory chip, a test control signal is supplied to a test control circuit, so that a spare memory cell array is tested whether spare memory cells are functionable for writing and reading of data. The test control signal is applied to terminals which are used for the supplying of an address signal, etc. For this purpose, the test control signal has a level different from that of the address signal. Therefore, the spare memory cell array can be tested simultaneously with a test of normal memory cell array.

3 Claims, 7 Drawing Sheets

SEMICONDUCTOR MEMORY APPARATUS WITH A SPARE MEMORY CELL ARRAY

FIELD OF THE INVENTION

This invention relates to a semiconductor memory apparatus with a spare memory cell array, and more particularly to, a semiconductor memory apparatus with a spare memory cell array having a structure to shorten a test time.

BACKGROUND OF THE INVENTION

A conventional semiconductor memory apparatus with a spare memory cell array includes a faulty address detecting circuit having a circuit for storing a faulty address which is an address of a faulty memory cell, and a circuit for comparing the faulty address and an address signal. In this faulty address detecting circuit, the faulty address is stored in the storing circuit in accordance with the cutting-off of a fuse by radiating laser light beam to the fuse. Thus, a supplied address signal is compared in the comparing circuit with the stored faulty address. In this address comparison, when the address signal is coincided with the stored faulty address, a control signal is supplied from the faulty address detecting circuit to an address signal decoder, by which a row of a normal memory cell array having the faulty address is prohibited to be selected, and a row is selected from the spare memory cell array for replacement of the faulty address of the normal memory cell array. Thus, yield is increased in fabricating a semiconductor memory apparatus.

However, the conventional semiconductor memory apparatus with a spare memory cell array has a disadvantage in that a test for a memory cell array must be carried out twice, because the normal memory cell array is tested at first, and the spare memory cell array is then tested. As a result, a time for test of a memory cell array becomes long to increase a fabricating cost.

SUMMARY OF THE INVENTION

Accordingly, it is an object of this invention to provide a semiconductor memory apparatus with a spare memory cell array which is tested in a shortened time.

It is a further object of this invention to provide a semiconductor memory apparatus with a spare memory cell array which is fabricated by a decreased fabricating cost.

According to this invention, a semiconductor memory apparatus with a spare memory cell array, comprises:

a normal memory cell array including normal memory cells arranged in a predetermined pattern, data being written into the normal memory cells and read therefrom;

a spare memory cell array including spare memory cells arranged in a predetermined pattern, data being written into at least one of the spare memory cells and read therefrom, when at least one of the normal memory cells is faulty; and terminals for supplying control signals including an address signal to a decoder for the normal memory cell array; and a test control circuit for selecting the spare memory cells to be enabled for writing and reading of data, and inhibiting the normal memory cells to be enabled by receiving a test control signal supplied from the terminals, the test control signal being of a logic level different from that of the control signal.

BRIEF DESCRIPTION OF THE DRAWINGS

This invention will be explained in more detail in conjunction with appended drawings, wherein.

DESCRIPTION OF THE PREFERRED EMBODIMENTS

Before explaining a semiconductor memory apparatus with a spare memory cell array in the first preferred embodiment according to the invention, the aforementioned semiconductor memory apparatus with a spare memory cell array will be explained in FIG. 1.

This semiconductor memory apparatus comprises a normal memory cell array 1, a spare memory cell array 2, an address buffer 3 connected to terminals $X_0$, $X_1$ . . . $X_m$, to which a row address signal is supplied, a row decoder 4 for decoding a row address signal, a faulty address detecting circuit 5 for generating control signals RE, $\overline{RE}_1$ and $\overline{RE}_2$, a column decoder/sense amplifier 6 connected to terminals $Y_0$, $Y_1$ . . . $Y_n$, to which a column address signal is supplied, and an output buffer 7, from which a content of a memory cell is supplied to an output terminal DT, and inverters 8 and 9 for inverting the control signals $\overline{RE}_1$ and $\overline{RE}_2$ to be supplied to the spare memory cell array 2 selecting as signals $SWL_1$ and $SWL_2$.

Figure 1:
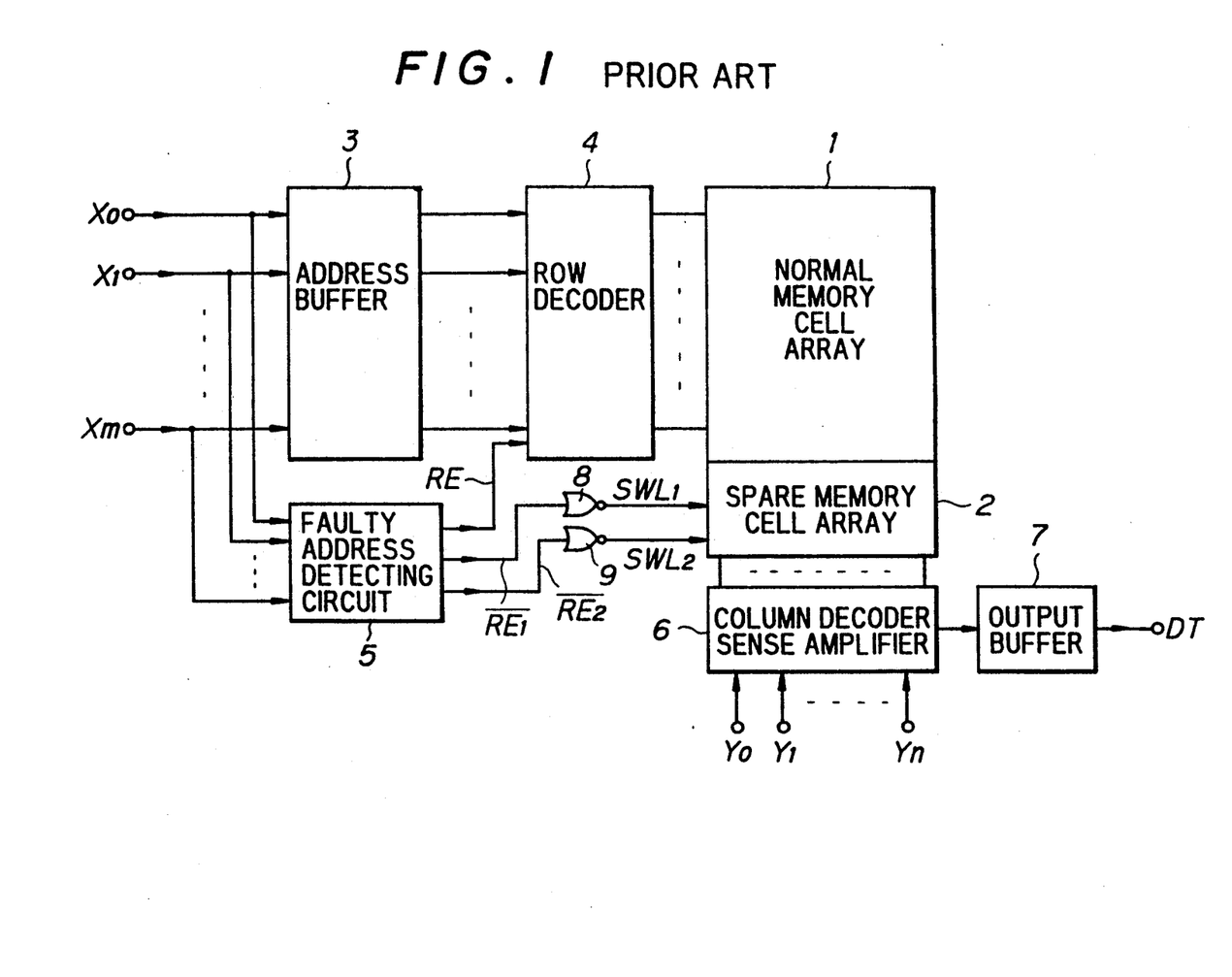
FIG. 1 is a block diagram showing a conventional semiconductor memory apparatus with a spare memory cell array.
Figure 2A:
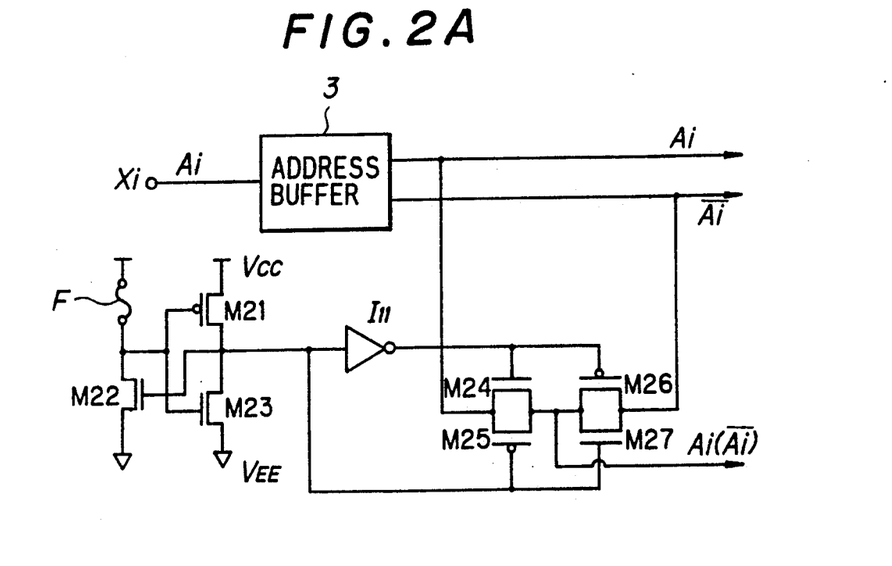
FIGS. 2A and 2B are circuitry diagrams showing a faulty address storing and comparing circuit, and a control signal gate circuit included in a faulty address detecting circuit of the conventional semiconductor memory apparatus with a spare memory cell array.

FIG. 2A shows a faulty address storing and comparing circuit included in the faulty address detecting circuit 5 shown in FIG. 1. This circuit comprises a storing portion having a fuse F, a p MOS transistor $M_{21}$, n MOS transistors $M_{22}$ and $M_{23}$, and a comparing portion having an inverter $I_{11}$, n MOS transistors $M_{24}$ and $M_{27}$, and p MOS transistors $M_{25}$ and $M_{26}$. In this faulty address storing and comparing circuit, where a memory cell corresponding to the fuse F is "faulty", the fuse F is cut off, so that a faulty address signal $A_i$ is generated in accordance with output signals $\overline{A}_i$ and $A_i$ supplied from the address buffer 3 receiving a bit signal $\overline{A}_i$ of an address signal supplied to the terminal $X_i$ ($i = 0 \sim (m+1)$).

Figure 2B:
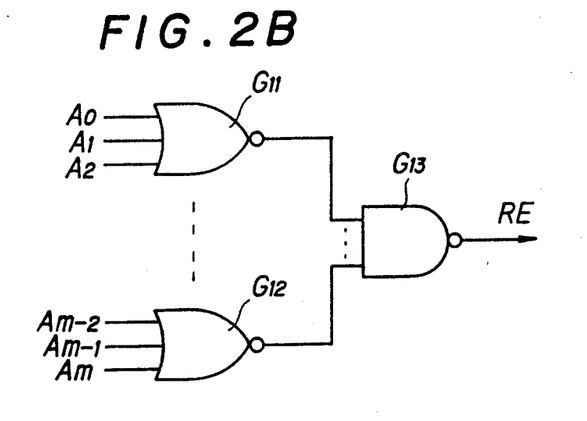

FIG. 2B shows a gate circuit which comprises NOR circuits $G_{11}$, . . . $G_{12}$ for receiving a non-faulty address signal $\overline{A}_i$ or a faulty address signal $A_i$, and a NAND circuit $G_{13}$ for providing the control signal RE.

Figure 2C:
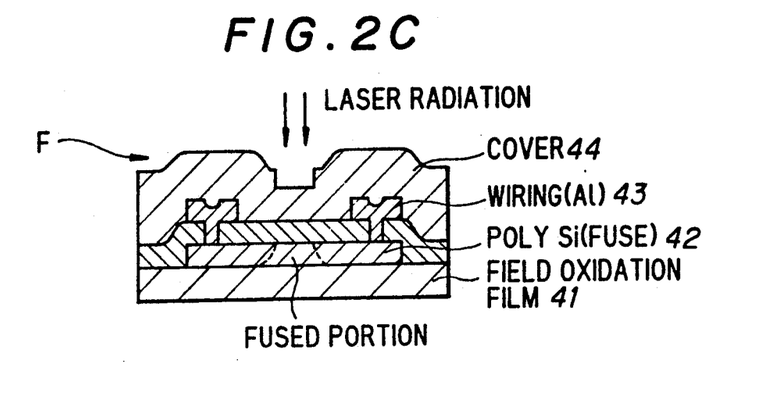
FIG. 2C is a schematic cross sectional view showing a fuse for storing a faulty address.

FIG. 2C shows a fuse F which comprises a field oxidation film 41, a fuse film 42 of poly-silicon, Al wirings 43 communicated by the fuse film 42, and a cover 44. In this fuse F, the fuse film 43 is cut off to disconnect the Al wirings 43 by receiving laser radiation as indicated by arrows.

In operation, a row address signal is supplied to the terminals $X_0, X_1 \ldots X_m$, so that the address buffer 3 and the faulty address detecting circuit 5 receive the address signal. The address buffer 3 holds the address signal to be supplied to the row decoder 4, in which the address signal is decoded to select a row of the normal memory cell array 1. In the faulty address detecting circuit 5, a row address having a faulty memory cell has been stored in the form of the cutting-off of the fuse F corresponding to the row address. When one of faulty addresses stored by the cut fuses F in the faulty address detecting circuit 5 is designated by a row address signal supplied thereto, the control signal RE becomes "high" to prohibit a row including a faulty memory cell to be selected by the row decoder 4, and one of the control signals $\overline{RE}_1$ and $\overline{RE}_2$ becomes "low" to select one of spare rows of the spare memory cell array 2 in accordance with the signals $SWL_1$ and $SWL_2$ inverted to be supplied to the spare memory cell array 2 by the inverters 8 and 9.

Figure 3:
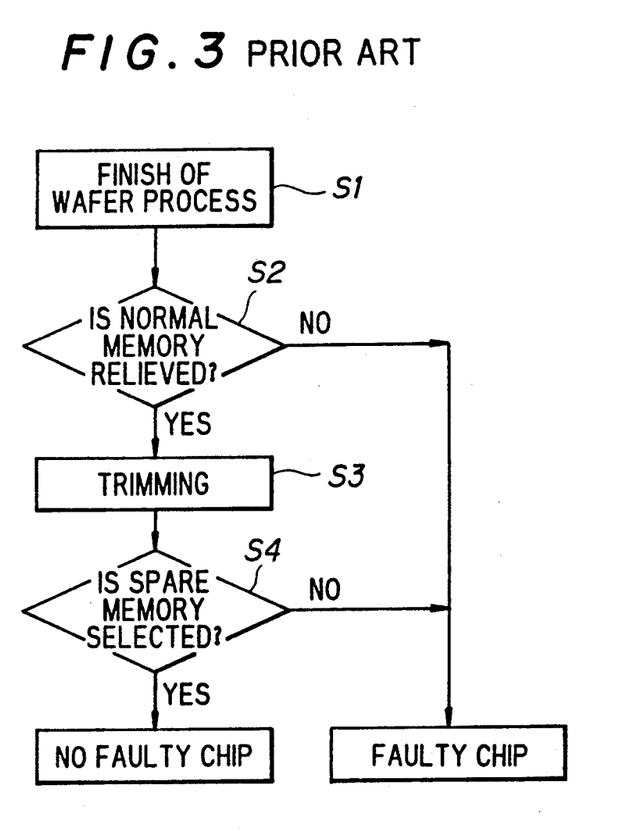
FIG. 3 is a flow chart showing a test operation in the conventional semiconductor memory apparatus with a spare memory cell array in FIG. 1.

FIG. 3 shows a flow chart, along which a test of the conventional semiconductor memory apparatus is carried out. In this flow chart, the processing of a wafer is finished at a step S1, and a function of a chip is checked to discriminate faulty chips from all processed chips at a step S2. In this check, an address of a faulty memory cell is determined by putting all memory cells of a normal memory cell array 1 in operation. Then, the faulty memory address is stored in a memory in a test equipment to then cut off a fuse F which is positioned to correspond to the faulty memory address. Thus, faulty chips will be relieved by a redunduncy structure having a spare memory cell array. Therefore, only when the number of faulty memory cells is too much to relieve a chip by use of a spare memory cell array, the chip is determined to be "faulty". Chips which will be relieved are trimmed by use of a laser trimmer at a step S3 and the fuses F are cut off. Then, chips which have passed the check of faulty memory cells are again checked whether the selection of a spare memory cell array is possible to be carried out for a faulty memory cell. For this purpose, a position of a faulty memory cell is read from the memory of the test equipment at a step S4. In this check, where it is detected for a chip at this step S4 that the cutting-off of a fuse is not complete, or that a selected row of the spare memory cell array includes a faulty memory cell, the chip is determined to be "faulty". As understood from the above test, the first and second checks are necessary to be carried out to determine whether a chip is faulty or not. As a result, it takes a long time to carry out the test, and a fabricating cost is increased, as explained before.

Next, a semiconductor memory apparatus with a spare memory cell array in the first preferred embodiment according to the invention will be explained in FIG. 4A. This semiconductor memory apparatus comprises a normal memory cell array 1 having memory cells of $2^{(m+1)} \times 2^{(n+1)}$, a spare memory cell array 2 having memory cells of $2 \times 2^{(n+1)}$, an address buffer 3 for holding an address signal supplied from terminals $X_0, X_1 \ldots X_m$, a row decoder 4 for decoding the address signal held by the address buffer 3, a faulty address detecting circuit 5 for selecting the spare memory cell array 2 in place of the normal memory cell array 1 in a state that a supplied address signal coincides with a stored faulty address, a column decoder/sense amplifier 6 for decoding an addressed signal supplied to terminals $Y_0, Y_1 \ldots Y_n$ and amplifying a content read out of an accessed memory cell, an output buffer 6 for holding the amplified content to be supplied to an output terminal DT, and a test control circuit 8 connected to the terminal $X_0$ and $X_1$ for controlling a test of the spare memory cell array 2 to be enabled for writing and reading of data. In this first preferred embodiment, control signals RE, $\overline{RE}_1$ and $\overline{RE}_2$ are generated in the faulty address detecting circuit 5 in the same manner as in FIG. 1, so that the control signal RE is supplied to the row decoder 4, while the control signals $\overline{RE}_1$ and $\overline{RE}_2$ are supplied to NOR circuits $G_3$ and $G_4$ to provide control signals $SWL_1$ and $SWL_2$ to the spare memory cell array 2. This semiconductor memory apparatus is characterized in that the test control circuit 8 is added to include inverters $I_1$, $I_2$ and $I_3$, and NAND circuit $G_1$ and $G_2$.

Figure 4A:
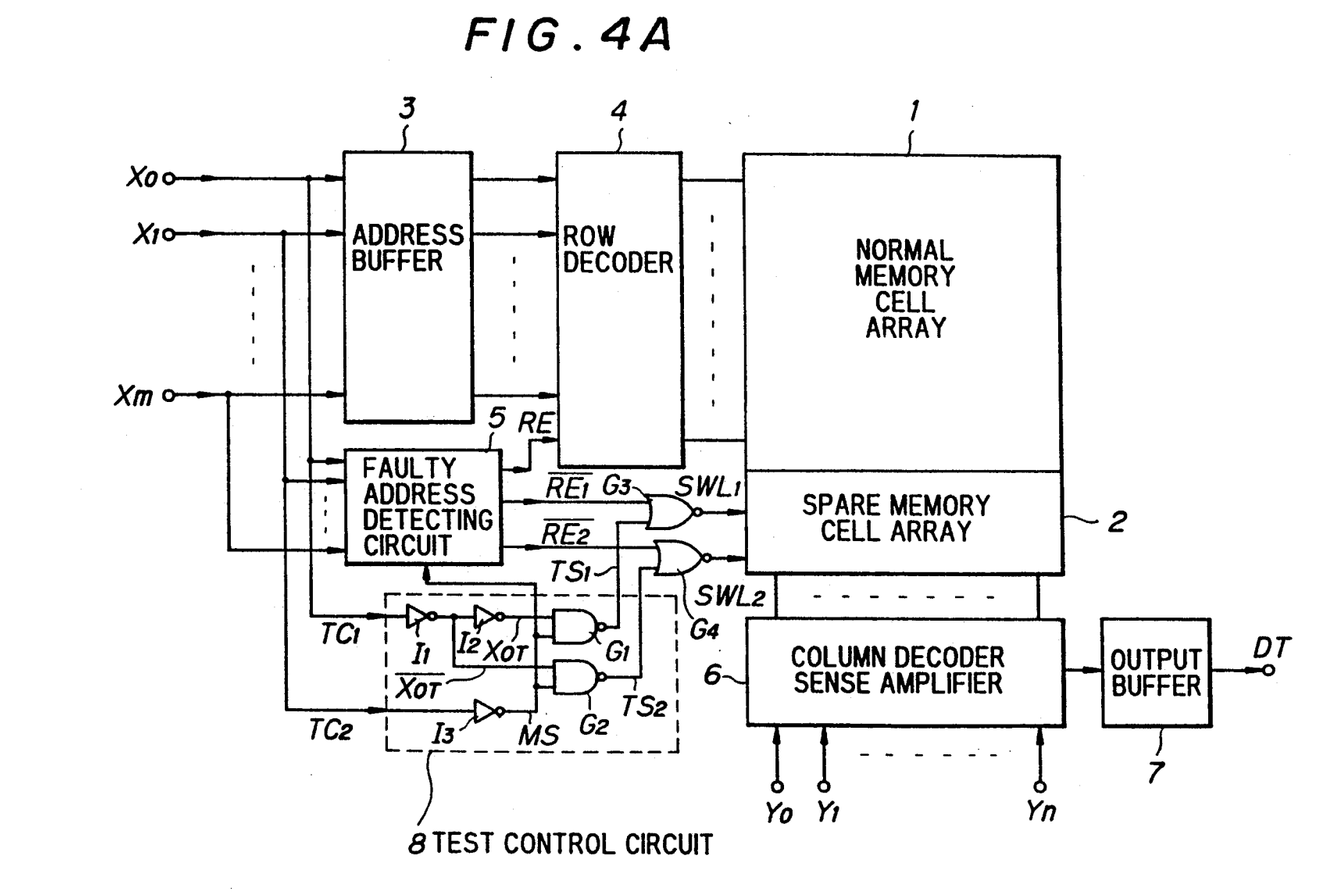
FIG. 4A is a block diagram showing a semiconductor memory apparatus with a spare memory cell array in a first preferred embodiment according to the invention.
Figure 4B:
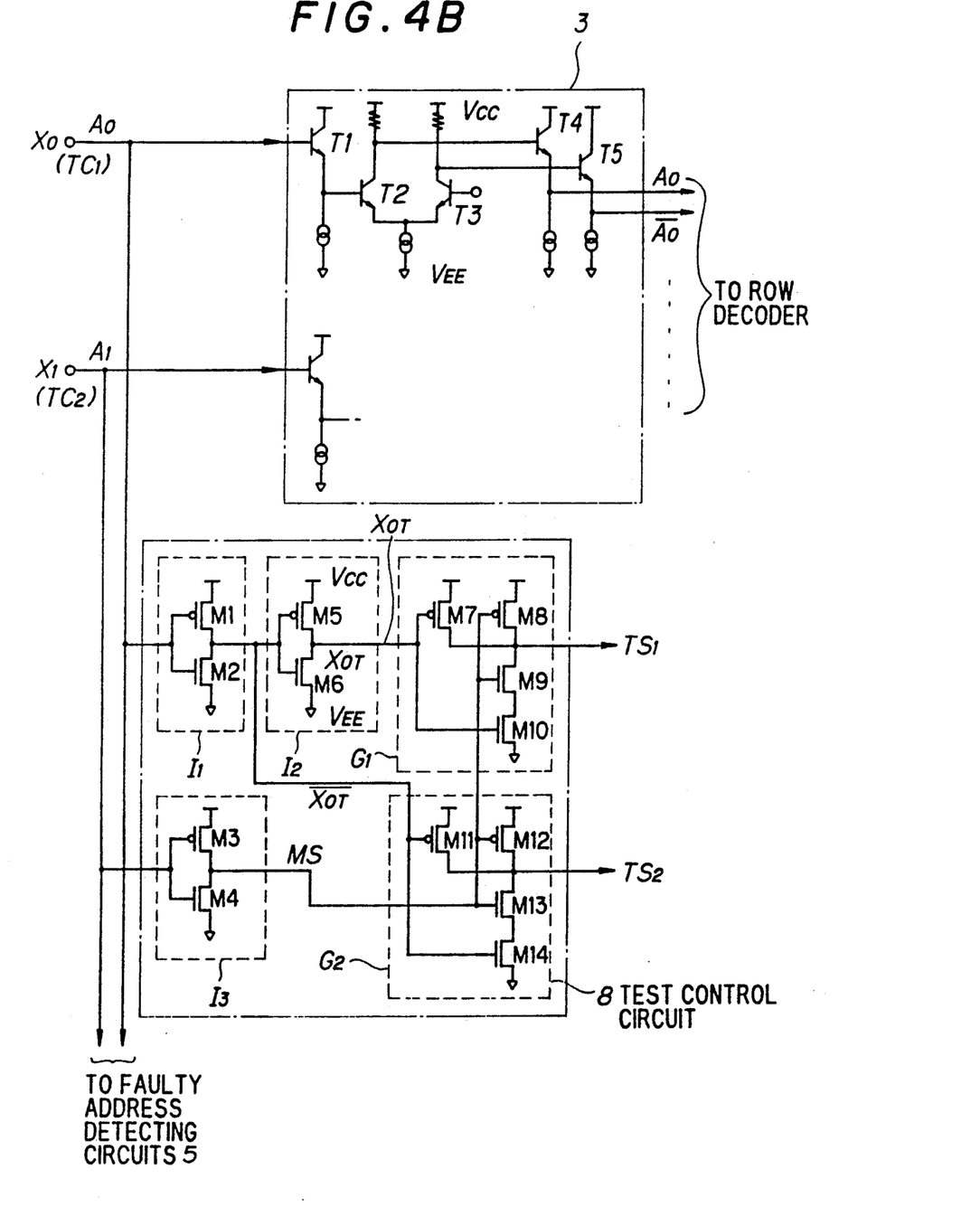
FIG. 4B is a circuitry diagram showing an address buffer and a test control circuit included in the semiconductor memory apparatus with a spare memory cell array in the first preferred embodiment.

FIG. 4B shows a part of the address buffer 3 which is of an ECL circuit having power supply voltages of $V_{CC}(=0V)$ and $V_{EE}(=-4.5 V$ or $-5.2 V)$, and the test control circuit 8. For instance, a circuit in the address buffer 3 connected to the terminal $X_0$, to which a bit signal $A_0$ of an address signal is supplied, includes transistors $T_1, T_2, T_3, T_4$ and $T_5$ connected to each other as shown therein to provide output signal $A_0$ and $\overline{A_0}$ which are supplied to the row decoder 4. On the other hand, the test control circuit 8 is connected to the terminals $X_0$ and $X_1$, and includes the inverters $I_1$, $I_2$ and $I_3$ having p and n MOS transistors $M_1$ and $M_2$, $M_3$ and $M_4$, and $M_5$ and $M_6$, respectively, and NAND circuits $G_1$ and $G_2$ having p MOS transistors $M_7$ and $M_8$, and $M_{11}$ and $M_{12}$, and n MOS transistors $M_9$ and $M_{10}$, and $M_{13}$ and $M_{14}$, respectively. In this test control circuit 8, predetermined voltages $V_{CC}$ and $V_{EE}$ are the same in level as in the address buffer 3, and output signals $TS_1$ and $TS_2$ are generated in accordance with test control signals $TC_1$ and $TC_2$ supplied from the terminals $X_0$ and $X_1$.

Operation of the above described semiconductor memory apparatus with a spare memory cell array will be explained.

The same operation as in the conventional memory apparatus is carried out and is not explained here.

In this circuit structure, the test control signals $TC_1$ and $TC_2$ are applied to the terminals $X_0$ and $X_1$ to be supplied to the address buffer 3, the faulty address detecting circuit 5, and the test control circuit 8. When, bit signals $A_0$ and $A_1$ of an address signal having high and low logic levels applicable to an ordinary ECL circuit, that is, $-0.9$ V is for a high level, $-1.7$ V is for a low level, and 800 mV is for an amplitude, are supplied to the terminals $X_0$ and $X_1$, the transistors $M_2$ and $M_4$ are turned on in the inverters $I_1$ and $I_3$ of the test control circuit 8, so that output signals $\overline{X_{OT}}$ and MS are decreased nearly to the power supply voltage $V_{EE}$. As a result, the output signals $TS_1$ and $TS_2$ of the NAND circuits $G_1$ and $G_2$ are "high", so that the spare memory cell array 2 is not selected. This means that the test control circuit 8 does not work, when it operates with the bit signals $A_0$ and $A_1$ of the address signal having a normal ECL level.

On the other hand, when a test control signal $TC_2$ which is of a level of the power supply voltage $V_{EE}$ lower than the ECL level is applied to the terminal $X_1$, the transistor $M_4$ is turned off to provide the output signal MS of "high", so that the output signals $TS_1$ and $TS_2$ of the NAND circuits $G_1$ and $G_2$ are determined by the output signal $\overline{X_{OT}}$ of the inverter $I_1$ and an output signal $X_{OT}$ of the inverter $I_2$. These output signals $\overline{X_{OT}}$ and $X_{OT}$ are in phase and out of phase relative to a control test signal $TC_1$ applied to the terminal $X_0$.

In the inverters $I_1$, $I_2$ and $I_3$, a threshold voltage is determined by a ratio $\beta_R$ between $\beta$ of the n MOS transistors $M_2$, $M_4$ and $M_6$ (defined "$\beta_n$") and $\beta$ of p MOS transistors $M_1$, $M_3$ and $M_5$ (defined "$\beta_p$"). Here, if it is assumed that the ratio $\beta_R$ ($\beta_n/\beta_p$) is larger than 5 ($\beta_R=\beta_n/\beta_p>5$), the inverters $I_1$, $I_2$ and $I_3$ are turned on and off, when a source-gate voltage of the n MOS transistors is approximately 1.5 V. That is, where a level of the test control signal $TC_1$ is decreased to be lower than $-3$ V which is more than the power supply voltage $V_{EE}$ by 1.5 V, the test control signal $TC_1$ is "low", so that the output signals $X_{OT}$ and $\overline{X_{OT}}$ are "low" and "high", respectively, according to a CMOS level.

Consequently, the output signals $TS_1$ and $TS_2$ are "high" and "low", respectively, so that the inverted signals $SWL_1$ and $SWL_2$ are "low" and "high", respectively. As a result, one of the two spare row corresponding to the inverted signal $SWL_2$ is selected in the spare memory cell array 2.

In this state, a column address signal supplied through the terminals $Y_0$, $Y_1$, ... $Y_n$ to the column decoder/sense amplifier 6 is changed to test each memory cell of the spare column corresponding to the selecting signal $SWL_2$. On the other hand, where the test control signal $TC_1$ is higher than $-3$ V, a spare column row corresponding to the selecting signal $SWL_1$ is selected in the spare memory cells of the selected spare column row are tested.

In this preferred embodiment, the faulty address detecting circuit 5 is no longer used to test each memory cell in the spare memory cell array 2. As a result, the number of tests is decreased to shorten a time for test. This means that the normal memory cell array 1 and the spare memory cell array 2 are tested simultaneously and separately.

Figure 5:
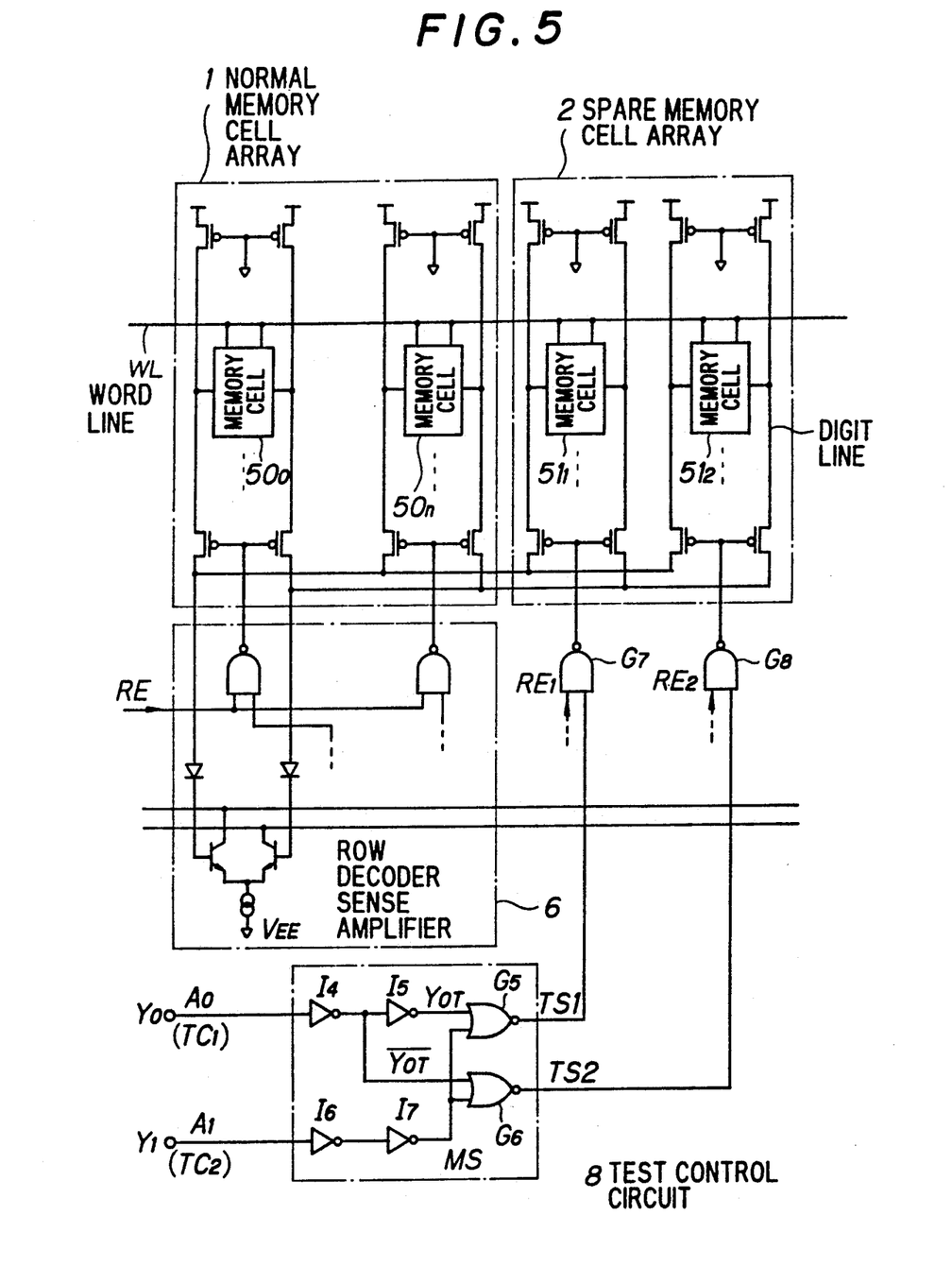
FIGS. 5 and 6 are block diagrams showing a semiconductor memory apparatus with a spare memory cell array in second and third preferred embodiments according to the invention.

FIG. 5 shows a part of a semiconductor memory apparatus with a spare memory cell array in the second preferred embodiment according to the invention, wherein there are shown a normal memory cell array 1, a spare memory cell array 2, a column decoder/sense amplifier 6 and a test control circuit 8. The normal memory cell array 1 comprises a predetermined number of memory cells $50_0$, ... $50_n$ for each word line WL to provide a matrix pattern of memory cells each connected to a corresponding pair of pMOS transistors, and the spare memory cell array 2 comprises two memory cells $51_1$, and $51_2$ for each word line WL to provide two spare columns of memory cells each connected to a corresponding pair of pMOS transistors. Further, the column decoder/sense amplifier 6 comprises a NAND circuit having two inputs, one of which receives the control signal RE, for each column of the normal memory cell array 1, and a pair of diodes and a pair of transistors connected to digit lines of each of the column, and the test control circuit 8 comprises inverters $I_4$, $I_5$, $I_6$ and $I_7$, and NOR circuits $G_5$ and $G_6$. In the test control circuit 8, output signals $\overline{Y_{OT}}$, $Y_{OT}$ and MS having the same meaning as the output signals $\overline{X_{OT}}$, $X_{OT}$ and MS of FIG. 4A and 4B are generated, and output signals $TS_1$ and $TS_2$ are supplied to NAND circuits $G_7$ and $G_8$ each having two inputs. Thus, the control signals $RE_1$ and $RE_2$ supplied to the spare memory cell array 2 are input to the respective inputs of the NAND circuits $G_7$ and $G_8$.

In this second preferred embodiment, bit signals $A_0$ and $A_1$ of a column address signal are applied to the terminals $Y_0$ and $Y_1$, so that the test control circuit 8 operates in the same manner as in FIGS. 4A and 4B. As apparent from this explanation, the NOR circuits $G_5$ and $G_6$ having the two inputs are provided in place of the NAND circuits $G_1$ and $G_2$ of FIGS. 4A and 4B, because the NAND circuits $G_7$ and $G_8$ having the two inputs are provided to select the spare memory cell array 2.

Figure 6:
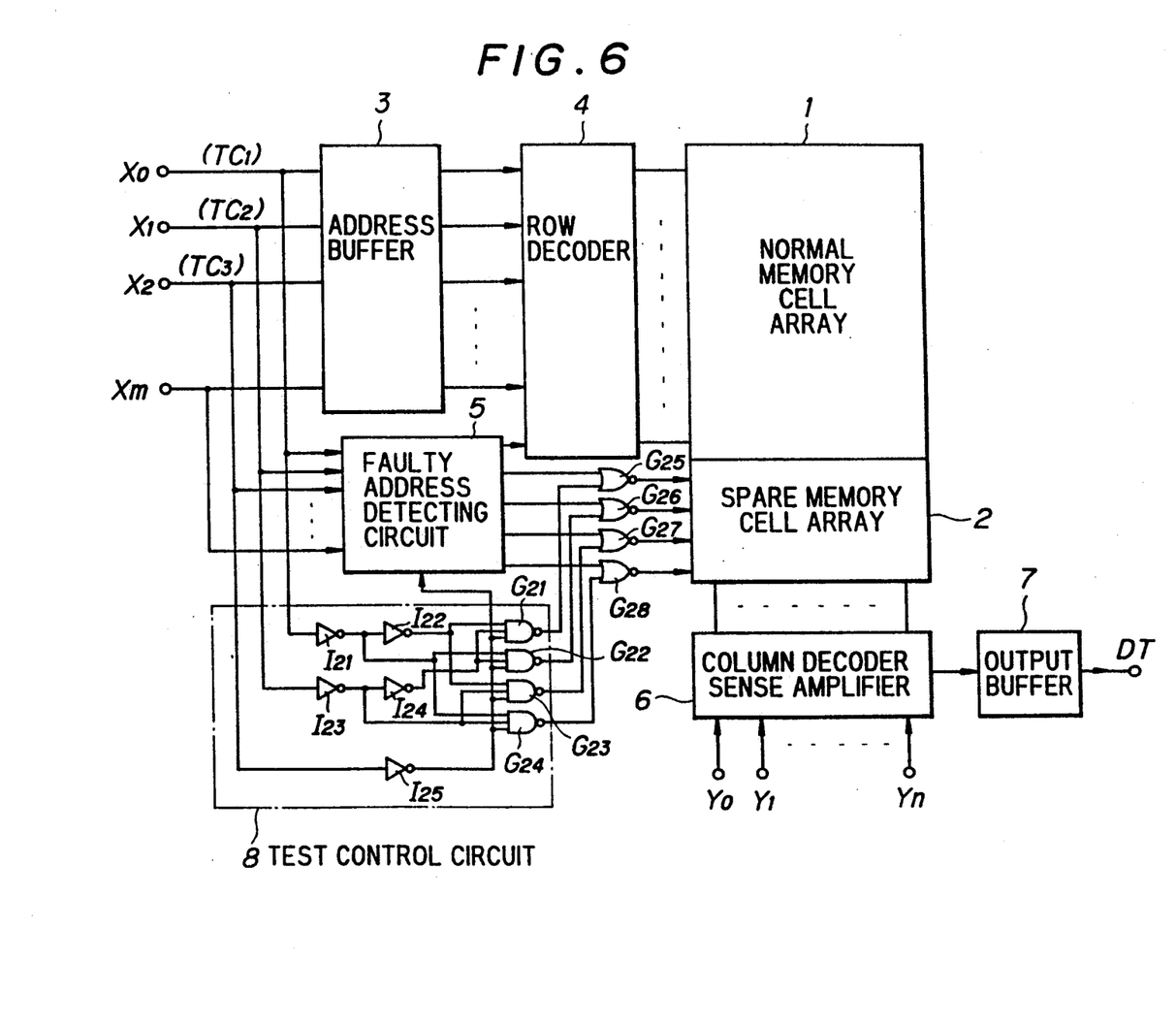

FIG. 6 shows a semiconductor memory apparatus with a spare memory cell array in the third preferred embodiment according to the invention, wherein like parts are indicated by like reference numerals as used in FIG. 4A. In the third preferred embodiment, a spare memory cell array 2 includes four rows of memory cells. For this structure, a test control circuit 8 includes five inverters $I_{21}$ to $I_{25}$, and four NAND circuits $G_{21}$ to $G_{24}$, and four NOR circuits $G_{25}$ to $G_{28}$ are provided between each of a faulty address detecting circuit 5 and the test control circuit 8 and the spare memory cell array 2.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor memory apparatus with a spare memory cell array, comprising:
   a normal memory cell array including normal memory cells arranged in a predetermined pattern, data being written into said normal memory cells and read therefrom;
   a spare memory cell array including spare memory cells arranged in a predetermined pattern, data being written into at least one of said spare memory cells and read therefrom, when at least one of said normal memory cells is faulty;
   terminals for supplying an address signal to an address signal decoder for said normal memory cell array;
   an address buffer for holding said address signal to be supplied to said decoder;
   a faulty address detecting circuit for generating a selecting signal to select said at least one of said spare memory cells, when said address signal held by said address buffer is an address of a faulty normal memory cell; and
   a test control circuit for selecting said spare memory cells to be enabled for writing and reading of data, and inhibiting said normal memory cells to be enabled by receiving a test control signal supplied from said terminals, said test control signal being of a logic level different from that of said address signal.

2. A semiconductor memory apparatus with a spare memory cell array, according to claim 1, wherein:
   said address buffer is of an ECL circuit;
   said address signal is of an ECL level; and said test control signal has a high level which is higher than a high level of said ECL level and a low level which is lower than a low level of said ECL level.

3. A semiconductor memory apparatus with a spare memory cell array, according to claim 1, wherein:
said faulty address detecting circuit, comprises:
means for storing an address of a faulty memory cell in said normal memory cell array;
means for comparing said address signal held by said address buffer with said address of said faulty memory cell; and
means for generating said selecting signal, when said address signal held by said address buffer is said address of said faulty memory cell.

* * * * *